United States Patent [19]

Teng-Ching et al.

[11] 4,423,465
[45] Dec. 27, 1983

[54] COMBINATION ELECTRONIC CIRCUIT ELEMENT WITH MULTIDIRECTIONALLY ADJUSTABLE JOINTS

[76] Inventors: Weng Teng-Ching, 2nd Fl., No. 13, Alley 3, La. 103, Hsiu Feng St., Chung Ho City, Taipei Hsien; Yang Chi-Ming, 3rd Fl., No. 5, La. 29, Fu Hsing Rd., Hsin Tien City, Taipei Hsien, both of Taiwan

[21] Appl. No.: 307,310

[22] Filed: Sep. 30, 1981

[51] Int. Cl.³ .............................................. H05K 7/10
[52] U.S. Cl. .................................. 361/394; 200/307; 361/396
[58] Field of Search ............... 361/393, 394, 396, 331, 361/380, 420, 426; 200/307, 51 R

[56] References Cited

U.S. PATENT DOCUMENTS 2,967,267  1/1961  Steinman et al. ............... 361/393 X
3,286,070 11/1966  Volker ........................... 200/307 X
4,224,484  9/1980  Haas et al. ...................... 200/307 X

FOREIGN PATENT DOCUMENTS 483734 11/1975 U.S.S.R. ............................. 361/393

Primary Examiner—G. P. Tolin
Attorney, Agent, or Firm—Burns, Doane, Swecker & Mathis

[57] ABSTRACT

A combinative electronic circuit element composed of a cube-shaped block having an electronic component assembled therein. The block contains a pair of recesses formed in one pair of its outer opposite surfaces and a pair of projections on another pair of outer opposite surfaces, hence a total of four block-engaging surfaces or four joints. To the bottom surface of each recess and to the top surface of each projection is fixed a contact plate, which is then connected to said electronic component within said block so that upon engagement of a recess of one block with a projection of another block, the two electronic components housed in the two blocks are in communication with each other. A plurality of blocks each containing a different electronic component can be put together according to a given electronic circuit diagram by bringing said recess and projection into union so as to form a complete electronic circuit. This invention provides, therefore, not only the ease with which said elements are combined, disassembled or rearranged but also the advantages of economy and practicality.

2 Claims, 8 Drawing Figures

COMBINATION ELECTRONIC CIRCUIT ELEMENT WITH MULTIDIRECTIONALLY ADJUSTABLE JOINTS

DETAILED DESCRIPTION

The present invention relates to a combinative electronic circuit element composed of a cube-shaped block having an electronic component assembled therein. The block contains a pair of recesses formed in one pair of its outer opposite surfaces and a pair of projections on another pair of outer opposite surfaces, hence a total of four block-engaging surfaces or four joints. To the bottom surface of each recess and to the top surface of each projection is fixed a contact plate, which is then connected to said electronic component within said block so that upon engagement of a recess of one block with a projection of another block, the two electronic components housed in the two blocks are in communication with each other. A plurality of blocks each containing a different electronic component can be put together according to a given electronic circuit diagram by bringing said recess and projection into union so as to form a complete electronic circuit. This invention provides, therefore, not only the ease with which said elements are combined, disassembled or rearranged but also the advantages of economy and practicality.

It is a common practice of the present day for technical schools or institutions that provide a practical course in electronic circuits to require students to solder electronic components on to printed circuit boards. As a purchase of different printed circuit boards and a full set of various electronic components must be made each time they are instructed to practice with a different circuit, students are heavily burdened with the cost incurred. Moreover, so time-consuming is the soldering of electronic components that the progress of teaching is delayed, and thus an immediate effect of learning can hardly be expected. Although there are plug-in electronic circuit kits available, they are generally so high-priced that students can hardly afford them. Also a flexible use of plug-in electronic circuit kits is impossible because the layout of circuits and the number of electronic components are limited by the small area of the breadboard which can accommodate only a finite number of electronic components.

In the light of the foregoing disadvantages, the inventor has come out with a combinative electronic circuit element.

The primary object of the present invention is to provide a combinative electronic circuit element for the field of electronics training. With each element adapted to contain a different electronic component, a plurality of such elements can be combined together, without the need for soldering, to form a complete electronic circuit.

Another object of the present invention is to provide a cube-shaped combinative electronic circuit element with multidirectionally adjustable joints in the form of a recess or a projection, upon engagement of which elements are connected, and so are the electronic components contained therein.

Still another object of the present invention is to provide an economic, convenient and practical instrument for the field of electronics training.

A further object of the present invention is to provide an electronic kit that is informative, intellectualizing and yet entertaining.

These and other objects and features of the present invention will be better understood from the following description taken in connection with the accompanying drawings.

Figure 1:
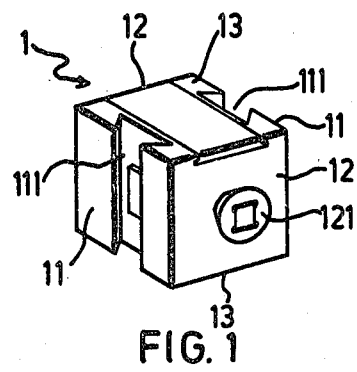
FIG. 1 is a perspective view of the block according to the present invention.
Figure 2:
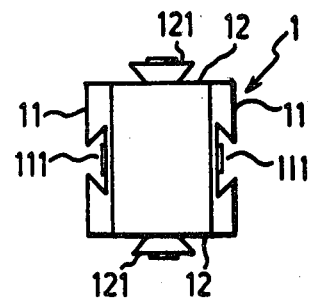
FIG. 2 is a top view of the block of FIG. 1.

With reference now to FIGS. 1 and 2, the element 1 of this invention finds a basic shape in a cubical plastic molding block with six square outer surfaces falling into three pairs of opposite surfaces whereof a first pair 11 each contains in the center a recess with a narrow opening and wide bottom. A second pair 12 each has a reverse cone-shaped projection 121 protruding outwardly from the center thereof, the free end of the projection 121 being larger than its inner end. A third pair 13 each is a plane surface.

Figure 3:
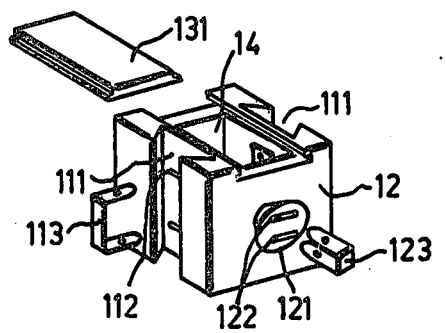
FIG. 3 is a schematic exploded view of the block according to the present invention.
Figure 4:
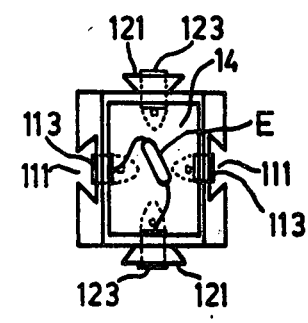
FIG. 4 is a top view of the block of FIG. 3.

Now with reference to FIGS. 3 and 4, one of the third pair 13 is provided in its center with a cover 131 which is inserted into the guide grooves to define a square cavity 14 thereunder. Disposed respectively in the bottom surface of each recess 111 and in the surface of each projection 121 are a pair of slots 112 for allowing insertion of a U-shaped metal contact plate 113 and a pair of slots 122 for allowing insertion of another U-shaped metal contact plate 123. The projecting prongs of contact plates 113 and 123 pass through slots 112 and 122 into the side walls of said cavity 14 wherein an electronic component E is contained. The electrodes (diode or triode) of the component E may be inserted through the bores in said prongs within said cavity if necessary. Said prongs are bent to abut against the inner side wall of said cavity so as to fix said contact plates on the one hand and hold the component E in place to insure the connection therebetween, on the other.

Figure 5:
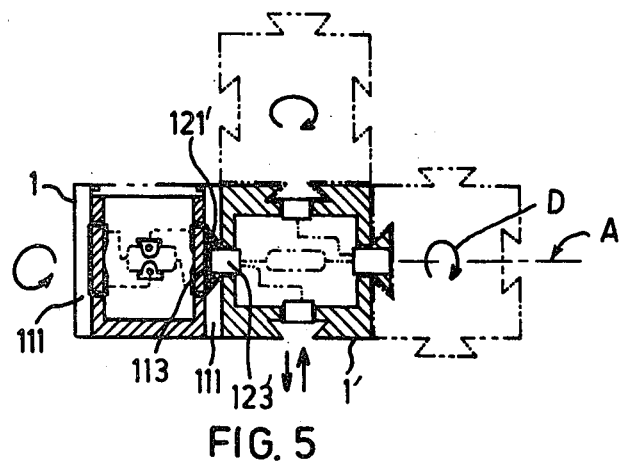
FIG. 5 is a cross sectional view of combined blocks according to the present invention.

Now with reference to FIG. 5, the recess 111 in the block 1 is capable of receiving from either end the projection 121' embedded in another block 1'. When the projection 121' is moved relative to said recess to reach at a predetermined position, i.e. the center of the recess 111 or when said blocks are aligned with each other, the contact plate 123' in the top surface of said projection 121' is tightly pressed against the contact plate 113 in the bottom surface of said recess 111 so that a circuit is connected. Shaped like a reverse cone, the projection in this embodiment will not fall off once engaged with the recess, while two blocks so combined are rotatable with respect to the projection in a direction D about the longitudinal axis A of the latter, thereby allowing multi-directional adjustments of the position of block-engaging surfaces till a desired joint fits with a joint on the block to be combined. With a pair of recesses and a pair of projections, or a total of four joints, each block is capable of substantially combining any other blocks.

The block of the present invention is adapted to contain an electronic component, the electrodes of which may be connected to said contact plates if necessary. The contact plates fixed to different side walls of said cavity may be connected by wires so that a wide latitude is provided in the selection of joints when combining different blocks, e.g. a recess of a block A may be engaged with a projection of another block B, or vice versa as selected. A student can assemble an electronic component in the cavity of a block by himself and mark the input and output ends of the electronic component on the outer surface of the block to facilitate the selection of a proper joint when combining blocks.

Figures 6, 7:
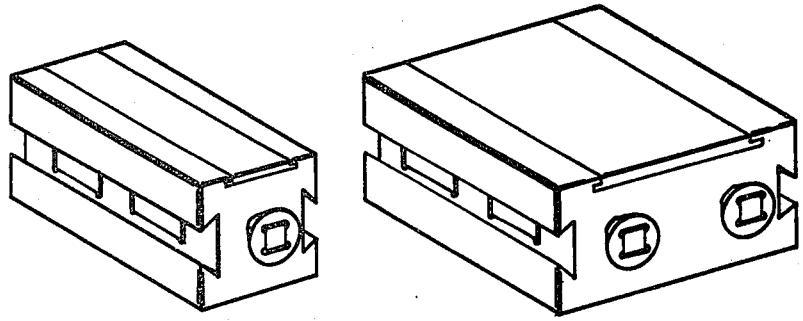
FIG. 6 shows an embodiment of the present invention.
FIG. 7 shows another embodiment of the present invention.

As can be seen from FIGS. 6 and 7, a block may be twice or four times the size of the previously described basic cube-shaped block so as to house bigger electronic components such as a battery or a transformer.

Figure 8:
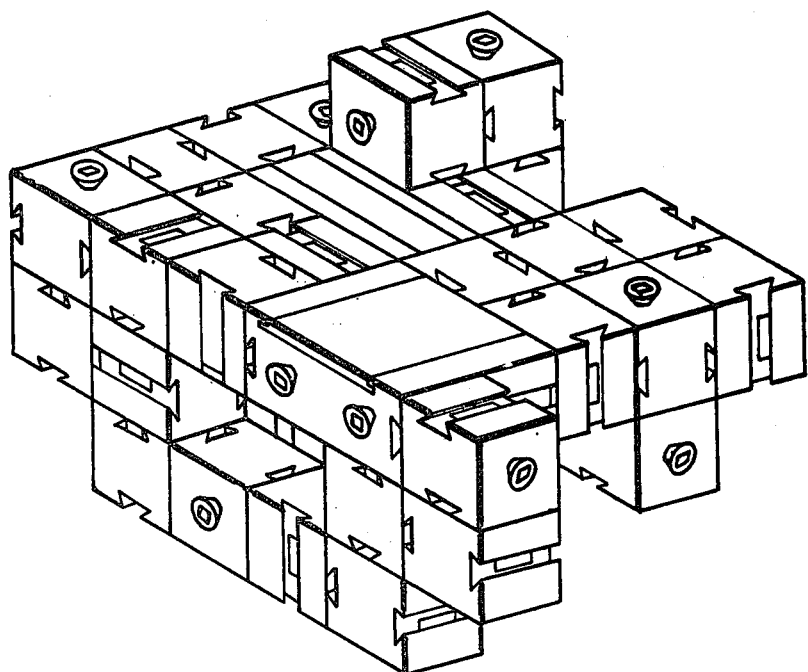
FIG. 8 is a schematic view of combined blocks according to the present invention.

After buying an adequate number of empty blocks and electronic components, the student may assemble the latter in the former (a wire may be used to connect the contact plates in the cavity if necessary) and then put on the block surface such marks as indicate the function of the assembled electronic component and the locations of its terminals to make the block an electronic circuit element ready for use. When practicing with electronic circuits, he may pick out required elements and combine them one by one following the instructions given in a circuit diagram so that a complete circuit is soon built and yet produces sound and optical effects. The combined blocks as shown in FIG. 8 appear aggregative and solid without taking up much space and can be taken apart for rearrangement conveniently. Apart from convenience, economy is found in building different circuits, for a flexible use of an adequate number of existing electronic components and blocks dispenses with unnecessary purchases of new sets of electronic components. Moreover, the element of this invention may serve as an intellectualizing toy because it combines instruction with amusement by providing a lot of fun in arranging for combination of blocks with multidirectionally adjustable joints. Thus it is of practical value.

We claim:

1. A circuit kit comprising a plurality of interconnectible circuit elements, each element comprising a hollow cube formed of plastic and defining six sides which comprise three pairs of mutually opposite sides, a first of said pairs of sides each having a recess with a narrow opening and a wide bottom and being open-ended, a second of said pairs of sides each having a projection of reverse cone-shape extending outwardly from the center of said second pair of sides such that an outer end of said projection is of larger diameter than an inner end thereof, a third of said pairs of sides each having a removable cover providing access to the interior of said element, a first metal contact plate disposed along said bottom of each of said recesses and including prong means extending into the interior of said element, a second metal contact plate disposed on said outer end of said projection and including prong means extending into the interior of said element, and electrical component means disposed within the interior of said element and electrically connected to said prong means of said first and second metal plates, said projections being sized for slidable endwise insertion into said open-ended recesses of another said element to make electrical contact between said first and second metal plates of said recess and said projection, said reverse cone-shaped projection and said recess being relatively rotatable about the longitudinal axis of said reverse cone-shaped projection to enable said elements to be mutually adjusted while in an interconnected condition.

2. A circuit kit according to claim 1, wherein said electrical component means include wires, said prong means are bent to grip said wires.

* * * * *